United States Patent
Chen et al.

(10) Patent No.: US 11,728,374 B2
(45) Date of Patent: *Aug. 15, 2023

(54) SEMICONDUCTOR DEVICE INCLUDING A CAPACITOR

(71) Applicant: TAIWAN SEMICONDUCTOR MANUFACTURING COMPANY, LTD., Hsinchu (TW)

(72) Inventors: Hong-Yang Chen, Hsinchu (TW); Tian Sheng Lin, Yangmei Township (TW); Yi-Cheng Chiu, New Taipei (TW); Hung-Chou Lin, Douliu (TW); Yi-Min Chen, Hsinchu (TW); Kuo-Ming Wu, Hsinchu (TW); Chiu-Hua Chung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/498,561

(22) Filed: Oct. 11, 2021

(65) Prior Publication Data

US 2022/0028967 A1 Jan. 27, 2022

Related U.S. Application Data

(63) Continuation of application No. 16/439,636, filed on Jun. 12, 2019, now Pat. No. 11,145,709.
(Continued)

(51) Int. Cl.
*H01L 27/108* (2006.01)
*H01L 29/76* (2006.01)
(Continued)

(52) U.S. Cl.
CPC .............. *H01L 28/60* (2013.01); *H01L 27/01* (2013.01); *H01L 27/0629* (2013.01)

(58) Field of Classification Search
CPC ..... H01L 28/60; H01L 27/01; H01L 27/0629; H01L 23/642; H01L 27/06; H01L 28/40;
(Continued)

(56) References Cited

U.S. PATENT DOCUMENTS 11,145,709 B2 * 10/2021 Chen ....................... H01L 27/01
2005/0098851 A1 5/2005 Nakayama et al.
(Continued)

FOREIGN PATENT DOCUMENTS

CN 1619815 A 5/2005
CN 104365183 A 2/2015
(Continued)

OTHER PUBLICATIONS

Notice of Allowance issued in corresponding Korean Application No. 10-2019-0119137, dated Nov. 26, 2021.
Non-Final Office Action issued in U.S. Appl. No. 16/439,636, dated Aug. 17, 2020.
Final Office Action issued in U.S. Appl. No. 16/439,636, dated Nov. 9, 2020.
Non-Final Office Action issued in U.S. Appl. No. 16/439,636, dated Mar. 2, 2021.
(Continued)

*Primary Examiner* — Theresa T Doan
(74) *Attorney, Agent, or Firm* — McDermott Will & Emery LLP (57) ABSTRACT

A capacitor structure for a power semiconductor device includes a semiconductor substrate, an isolation insulating layer having a ring-shape and including an outer periphery and an inner periphery defining an opening region, a first electrode disposed on the isolation insulating layer, a dielectric layer disposed on the first electrode, and a second electrode disposed on the dielectric layer.

20 Claims, 9 Drawing Sheets

Related U.S. Application Data (60) Provisional application No. 62/738,642, filed on Sep. 28, 2018.

(51) Int. Cl.
*H01L 31/119* (2006.01)
*H01L 49/02* (2006.01)
*H01L 27/01* (2006.01)
*H01L 27/06* (2006.01)

(58) Field of Classification Search
CPC ............... H01L 21/0226; H01L 21/762; H01L 21/768; H01L 21/8234; H01L 29/66045; H01L 29/772; H01L 29/92; H01G 4/005; H01G 4/008; H01G 4/012; H01G 4/33; H01G 4/40; H01G 17/00
USPC ............................................. 257/296
See application file for complete search history.

(56) References Cited

U.S. PATENT DOCUMENTS

| | | |
|---|---|---|
| 2006/0145251 A1 | 7/2006 | Ko |
| 2011/0062505 A1 | 3/2011 | Omura |
| 2015/0137694 A1 | 5/2015 | Hong et al. |
| 2017/0338354 A1 | 11/2017 | Fujie et al. |

FOREIGN PATENT DOCUMENTS

| | | |
|---|---|---|
| JP | 4457846 B2 | 2/2010 |
| JP | 4601247 B2 | 12/2010 |
| JP | 2015-053350 A | 3/2015 |
| KR | 10-2006-0078861 A | 7/2006 |
| KR | 10-2012-0022519 A | 3/2012 |

OTHER PUBLICATIONS

Notice of Allowance issued in U.S. Appl. No. 16/439,636, dated Jun. 10, 2021.

\* cited by examiner

SEMICONDUCTOR DEVICE INCLUDING A CAPACITOR

RELATED APPLICATIONS

This application is a division of U.S. patent application Ser. No. 16/439,636, filed Jun. 12, 2019, now U.S. Pat. No. 11,145,709, which claims priority of U.S. Provisional Patent Application No. 62/738,642 filed on Sep. 28, 2018, the entire contents of each of which are incorporated herein by reference.

BACKGROUND

Semiconductor devices include capacitors integrated on a semiconductor substrate. When a semiconductor device is a high-voltage semiconductor device, such as a power semiconductor device, a capacitor integrated therewith should also have a high breakdown voltage, for example, more than about 400 V.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, at least one of A, B and C means "A," "B," "C," "A and B," "A and C," "B and C," or "A, B and C," and does not mean that one from A, one from B and one from C, unless otherwise indicated.

A capacitor structure formed over a substrate of a semiconductor device includes a bottom electrode, an upper electrode and a dielectric layer disposed between the bottom electrode and the upper electrode, which are vertically stacked (perpendicular to the surface of the substrate). Such a stacked capacitor structure is formed over an isolation insulating layer to electrically isolate adjacent devices. In the present disclosure, a capacitor structure that has a breakdown voltage higher than 600 V will be provided.

Figure 1A:
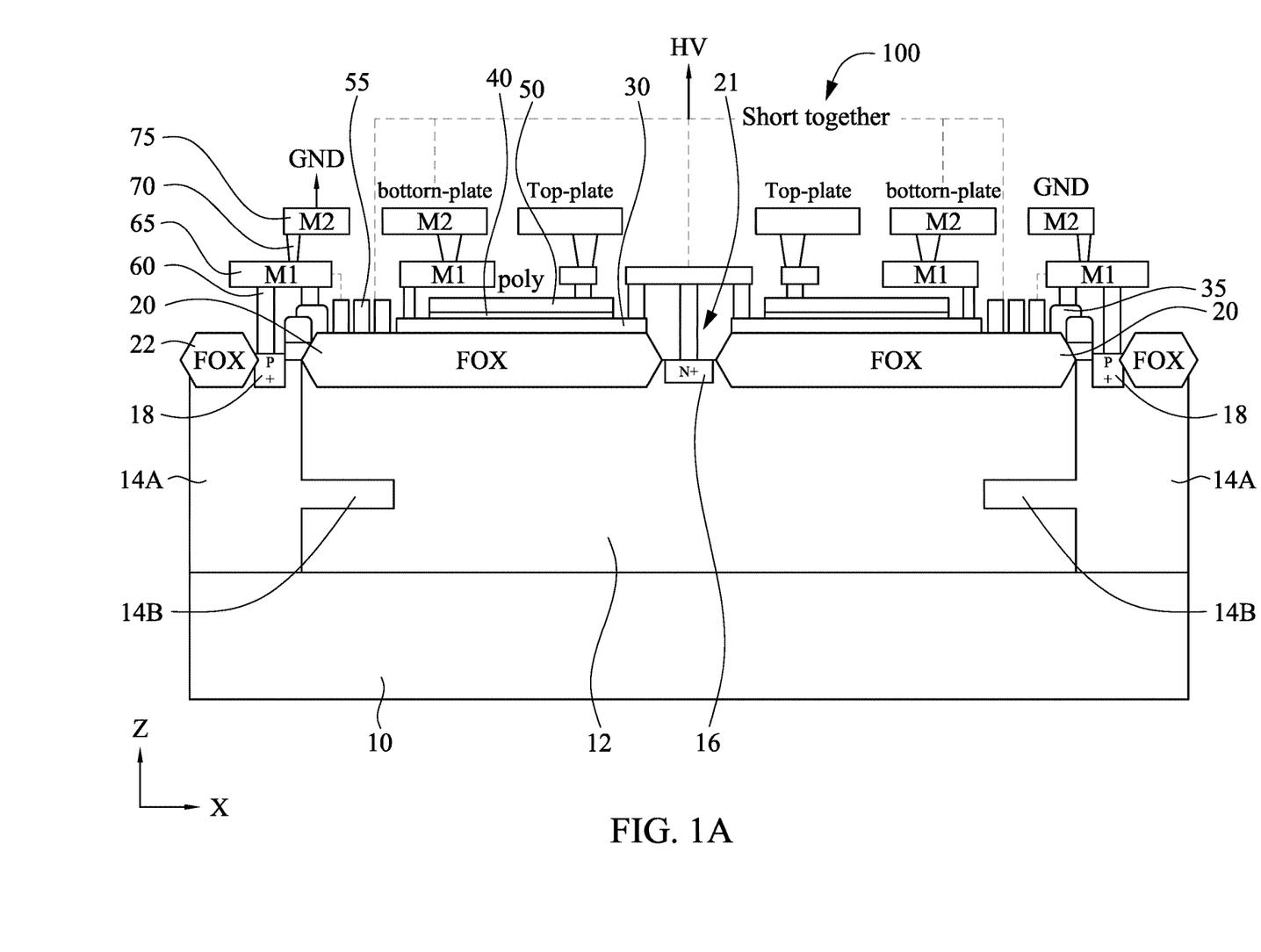
FIG. 1A shows a cross sectional view of a capacitor structure for a semiconductor device according to an embodiment of the present disclosure.
Figure 2:
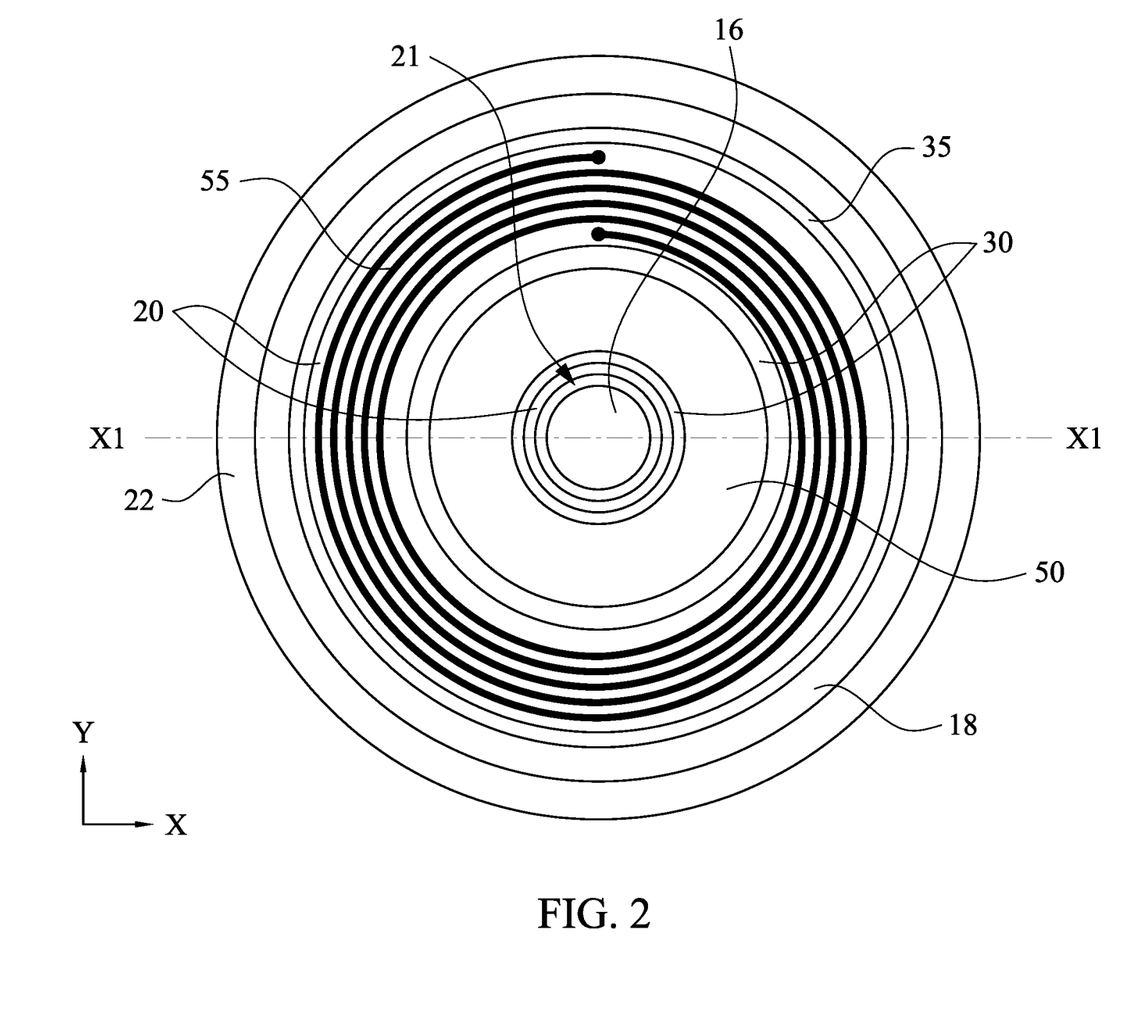
FIG. 2 shows a top (plan) view of the capacitor structure shown in FIG. 1A.

FIG. 1A shows a cross sectional view of a capacitor structure 100 for a semiconductor device according to an embodiment of the present disclosure. FIG. 2 shows a top (plan) view of the capacitor structure 100 shown in FIG. 1A.

The capacitor structure 100 is formed over a substrate 10. In some embodiments, the substrate 10 is a semiconductor substrate. In some embodiments, the substrate 10 is made of a suitable elemental semiconductor, such as silicon, diamond or germanium; a suitable alloy or compound semiconductor, such as Group IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium nitride (GaN), indium gallium nitride (InGaN), aluminum nitride (AlN), indium aluminum nitride (InAlN), gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. In certain embodiments, a p-type Si substrate is used.

At the surface of the semiconductor substrate 10, isolation insulating layers (field oxide) layers 20 and 22 are formed. As shown in FIG. 2, a first isolation insulating layer 20 has a ring, a doughnut or a frame shape (these shapes may be collectively referred to as a ring shape) having a center opening 21. A size (area) of the center opening 21 defined by the inner periphery of the first isolation insulating layer 20 is in a range from about 0.01% to about 10% of a size of an area defined by the outer periphery of the isolation insulating layer 20. When the first isolation insulating layer 20 and the center opening 21 are both circular, the area of the center opening 21 is about 0.01% to about 10% of the area of the circle defined by the outer periphery of the first isolation insulating layer 20.

A second isolation insulating layer 22 also has a doughnut, a ring, or a frame shape and surrounds the first isolation insulating layer 20 in some embodiments. In other embodiments, the outer periphery of the second isolation insulating layer has a rectangular shape (rectangular ring).

The first and second isolation insulating layers 20, 22 include one or more layers of silicon oxide, silicon nitride, titanium oxide, aluminum oxide or any other suitable insulating materials. In certain embodiment, silicon oxide is used. In some embodiments, the first and second isolation insulating layers 20, 22 are local oxidation of silicon (LOCOS) layers formed by oxidizing desired portions of the silicon substrate. In other embodiments, the first and second isolation insulating layers 20, 22 are shallow trench isolation (STI) layers, formed by filling trenches formed at the surface of the semiconductor substrate 10 with an insulating material, such as silicon oxide. In some embodiments, the thickness of the first and second isolation insulating layers 20, 22 in a range from about 0.1 μm to about 5.0 μm, and is in a range from about 0.5 μm to about 2.0 μm in other embodiments.

In the semiconductor substrate 10, various wells are formed. As shown in FIG. 1A, an n-well 12 (a first conductivity type well) is formed below the first isolation layer 20 in some embodiments. Further, as shown in FIG. 1A, a first p-well 14A and a second p-well 14B (second conductivity type wells) are formed in the semiconductor substrate around the n-well 12. The first p-well 14A is disposed below the second isolation insulating layer 22 and below an area between the first isolation insulating layer 20 and the second isolation insulating layer 22 in some embodiments. The second p-well 14B penetrates into the n-well 12 under the first isolation insulating layer 20 in some embodiments. The first p-well 14A has a doughnut, a ring, or a frame shape similar to the first isolation insulating layer 20 and/or the second isolation insulating layer 22, and surrounds the n-well 12 in some embodiments. The n-well 12 is formed by one or more ion implantation operations with P, As and/or Sb as dopant, at an acceleration voltage of about 20 keV to about 200 keV in some embodiments. The doping concentration is in a range from about $0.1 \times 10^{11}$ ions/cm$^2$ to about $1 \times 10^{13}$ ions/cm$^2$, in some embodiments. The first and second p-wells 14A and 14B are formed by one or more ion implantation operations with B (BF$_2$), Al and/or Ga as dopant, at an acceleration voltage of about 20 keV to about 200 keV in some embodiments. The doping concentration is in a range from about $0.1 \times 10^{11}$ ions/cm$^2$ to about $1 \times 10^{13}$ ions/cm$^2$, in some embodiments In addition, as shown in FIG. 1A, an n+ region (heavily doped region) 16 is formed at the surface region of the substrate 10 within the center opening 21 of the first isolation insulating layer 20, and a p+ region (heavily doped region) 18 is formed at the surface region of the substrate 10 at the area between the first isolation insulating layer 20 and the second isolation insulating layer 22. In some embodiments, the p+ region 18 spans all the surface region of the substrate 10 between the first isolation insulating layer 20 and the second isolation insulating layer 22, forming a doughnut, ring or frame shape, and in other embodiments, the p+ region is partially formed in the surface region of the substrate 10 between the first isolation insulating layer 20 and the second isolation insulating layer 22.

The n-well 12, the first p-well 14A, the second p-well 14B, the n+ region 16 and the p+ region 18 constitute a reduced surface field (RESURF) well structure in some embodiments. In other embodiments, the semiconductor substrate 10 is an n-type, and the conductivity types of the well structures as set forth above are opposite.

Still referring to FIGS. 1A and 2, a first conductive layer 30, as a bottom electrode of a capacitor, is formed over the first isolation insulating layer 20. The first conductive layer 30 has a doughnut, a ring, or a frame shape similar to the first isolation insulating layer 20 in some embodiments. The first conductive layer 30 is made of poly silicon in some embodiments. In certain embodiments, the poly silicon is doped poly silicon, doped with impurities, such as P, As and/or B. In other embodiments, the first conductive layer 30 is amorphous silicon. Other suitable conductive materials may be used as the first conductive layer 30. A thickness of the first conductive layer 30 is in a range from about 50 nm to about 5000 nm in some embodiments. The area of the first conductive layer 30 in plan view is smaller than the area of the first isolation insulating layer 20 in some embodiments.

A capacitor dielectric layer 40 is disposed on the first conductive layer 30 as shown in FIG. 1A. The capacitor dielectric layer 40 may be one or more layers of silicon oxide, silicon nitride, titanium oxide, aluminum oxide or any other suitable insulating materials. In certain embodiments, silicon oxide is used as the capacitor dielectric layer 40. The capacitor dielectric layer 40 has a doughnut, a ring, or a frame shape similar to the first isolation insulating layer 20 in some embodiments. A thickness of the capacitor dielectric layer 40 is in a range from about 5 nm to about 500 nm in some embodiments. The area of the capacitor dielectric layer 40 in plan view is smaller than the area of the first conductive layer 30 in some embodiments.

Further, a second conductive layer 50, as a top electrode of the capacitor, is formed over the capacitor dielectric layer 40, as shown in FIG. 1A. The second conductive layer 50 has a doughnut, a ring, or a frame shape similar to the first isolation insulating layer 20 in some embodiments. The area of the second conductive layer 50 in plan view is smaller than the area of the first conductive layer 30 in some embodiments. The second conductive layer 50 is made of poly silicon in some embodiments. In certain embodiments, the poly silicon is doped poly silicon, doped with impurities, such as P, As and/or B. In other embodiments, the second conductive layer 50 is amorphous silicon. Other suitable conductive materials may be used as the second conductive layer 50. A thickness of the second conductive layer 50 is in a range from about 50 nm to about 5000 nm in some embodiments. In some embodiments, a sheet resistance of the second conductive layer 50 is higher than sheet resistance of the first conductive layer 30. In some embodiments, when the first and second conductive layers 30, 50 are polysilicon, the doping concentration of the second conductive layer 50 is lower than the doping concentration of the first conductive layer 30. The first conductive layer 30, the capacitor dielectric layer 40 and the second conductive layer 50 constitute a capacitor.

Still referring to FIGS. 1A and 2, an outer conductive layer 35 is formed covering the outer periphery of the first isolation insulating layer 20. In some embodiments, the outer conductive layer 35 has a doughnut, a ring, or a frame shape and surrounds the first conductive layer 30, the capacitor dielectric layer 40 and the second conductive layer 50. In some embodiments, the outer conductive layer 35 is made of the same material as the first conductive layer 30.

Further, a resistor wire 55 is formed over the first isolation insulating layer 20, as shown in FIGS. 1A and 2. In some embodiments, the resistor wire 55 is disposed between the first conductive layer 30 and the outer conductive layer 35. In some embodiments, the resistor wire 55 is made of the same material as the second conductive layer 50.

In some embodiments, the resistor wire 55 has a spiral shape winding around the capacitor as shown in FIG. 2. The number of turns of the spiral shape winding around the capacitor is one to 100 in some embodiments and is two to 20 in other embodiments. In certain embodiments, the number of turns is five to ten. A width of the resistor wire 55 in plan view is in a range from about 0.2 μm to about 2 μm in some embodiments. The resistor wire 55 is electrically connected to the first conductive layer 30 and the outer conductive layer 35, which is electrically connected to a fixed potential, such as the ground (terminal). In some embodiments, the resistor wire 55 has a serpentine shape disposed around the capacitor or disposed side of the capacitor.

As shown in FIG. 1A, various via contacts including first via contacts 60 and second via contacts 70 and metal wiring layers including first metal wirings 65 and second metal wirings 75 are formed over the substrate 10 to directly or electrically connect various elements of the capacitor structure 100. The via contacts 60 and 70 are made of one or more conductive materials, such as. Al, Cu, AlCu, Ti, TiN, Ta, TaN, Co, Ni, W or silicide or any other suitable material. The metal wirings 65 and 75 are made of one or more conductive materials, such as Al, Cu, AlCu, Ti, TiN, Ta, TaN, Co, Ni, W or silicide or any other suitable material.

In some embodiments, the n+ region 16 is connected to the first conductive layer 30 by first via contacts 60 and a first metal wiring 65. The p+ region 18 is connected to the outer conductive layer 35 by first via contacts 60 and a first wiring 65, and the p+ region 18 and the outer conductive layer 35 are connected to the fixed potential, such as the ground, by a second via contact 70 and a second metal wiring 75, in some embodiments. Further, a first via contact 60 is connected to the second conductive layer 50, and a first metal wiring 65, a second via contact 70 and a second metal wiring 75 are stacked over the first via contact 60, in some embodiments. Similarly, a first via contact 60 is connected to the first conductive layer 30, and a first metal wiring 65, a second via contact 70 and a second metal wiring 75 are stacked over the first via contact 60 in some embodiments. As shown in FIG. 1A, the other end of the resistor wire 55 not coupled to the fixed potential, the first conductive layer 30 and the n+ region 16 are electrically connected to each other by one or more of the first and second via contacts, first and second metal wirings and/or one or more via contact and metal wirings formed above the second metal wirings.

In operation of the capacitor structure 100 of the present disclosure, a high voltage HV, for example about 400V to about 1000 V, is applied to the first conductive layer 30 (bottom electrode). The high voltage HV is also applied to one end of the resistor wire 55 and the n+ region 16 at the substrate 10. The other end of the resistor wire 55 is coupled to the ground (0 V). Due to the spiral resistor wire 55, the voltage gradually decreases from the center of the capacitor to the edge of the capacitor. In addition, due to the RESURF well structure, the voltage of the first conductive layer 30 over the first isolation insulating layer 20 gradually decreases from the center of the capacitor to the edge of the capacitor. These voltage reductions cause a voltage difference across the first isolation insulating layer 20 to be smaller than the breakdown voltage of the first isolation insulating layer 20, which is about 400 V, when the first isolation insulating layer 20 is a silicon oxide. Thus, the capacitor structure 100 of the present disclosure can operate at a voltage higher than 400 V.

Figure 1B:
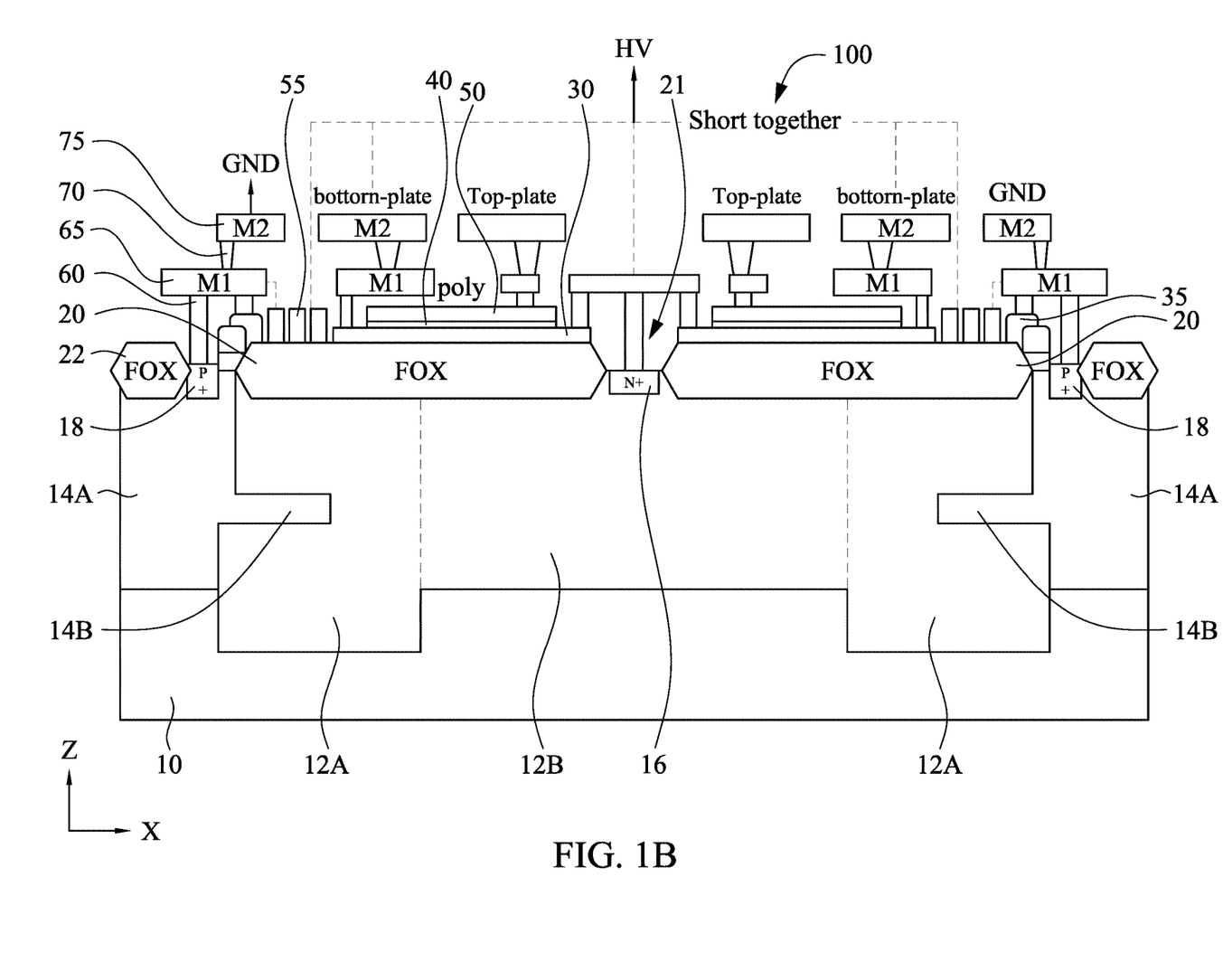
FIG. 1B shows a cross sectional view of a capacitor structure for a semiconductor device according to another embodiment of the present disclosure.

FIG. 1B shows a cross sectional view of a capacitor structure for a semiconductor device according to another embodiment of the present disclosure.

As shown in FIG. 1B, the n-well includes a first n-well 12A and a second n-well 12B (first conductivity type wells) formed below the first isolation layer 20. In certain embodiments, the first n-well 12A is distributed deeper than the second n-well 12B. The first n-well 12A has a doughnut, a ring, or a frame shape similar to the first isolation insulating layer 20 and surrounds the second n-well 12B in some embodiments. Further, as shown in FIG. 1B, the first p-well 14A and the second p-well 14B are formed in the semiconductor substrate around the first n-well 12A. The second p-well 14B penetrates into the first n-well 12A under the first isolation insulating layer 20 in some embodiments. The first p-well 14A has a doughnut, a ring, or a frame shape similar to the first isolation insulating layer 20 and surrounds the first n-well 12A in some embodiments. The first n-well 12A, the second n-well 12B, the first p-well 14A, the second p-well 14B, the n+ region 16 and the p+ region 18 constitute a reduced surface field (RESURF) well structure.

FIGS. 3A-6B show various stages of a manufacturing operation for a semiconductor device including a capacitor structure according to an embodiment of the present disclosure. It is understood that additional operations can be provided before, during, and after the processes shown by FIGS. 3A-6B, and some of the operations described below can be replaced or eliminated, for additional embodiments of the method. The order of the operations/processes may be interchangeable. Materials, structures, configurations, dimensions and/or processes the same as or similar to the foregoing embodiments described with FIGS. 1A, 1B and 2 may be employed in the following embodiments, and a detailed explanation thereof may be omitted. FIGS. 3A, 4A, 5A and 6A are cross sectional views and FIGS. 3B, 4B, 5B and 6B are top views (plan views).

Figure 3A:
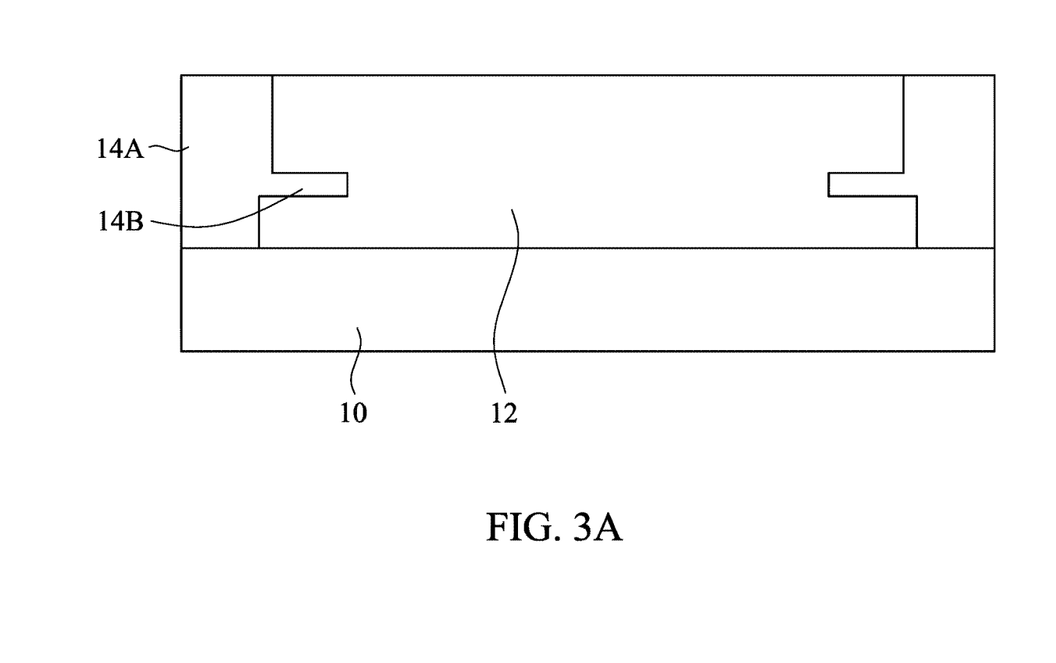
FIGS. 3A and 3B show one of the various stages of a manufacturing operation for a capacitor structure according to an embodiment of the present disclosure.
Figure 3B:
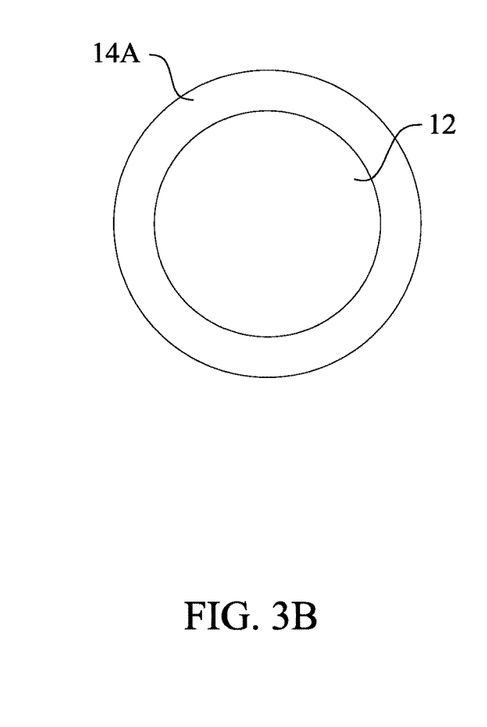

As shown in FIGS. 3A and 3B, first conductivity well (e.g., n-wells) and second conductivity well (e.g., p-wells) are formed. In some embodiments, an n-well 12 (or a first n-well 12A and a second n-well 12B) is formed by a thermal diffusion method or an ion implantation method. Impurities for the first and second n-well are P and/or As. Further, a first p-well 14A and a second p-well 14B are formed by a thermal diffusion method or an ion implantation method. Impurities for the first and second p-well are B (BF$_2$). In some embodiments, the n-well 12 is formed and then the p-wells 14A and 14B are formed. In other embodiments, the p-wells 14A and 14B are formed and then the n-well 12 is formed.

Figure 4A:
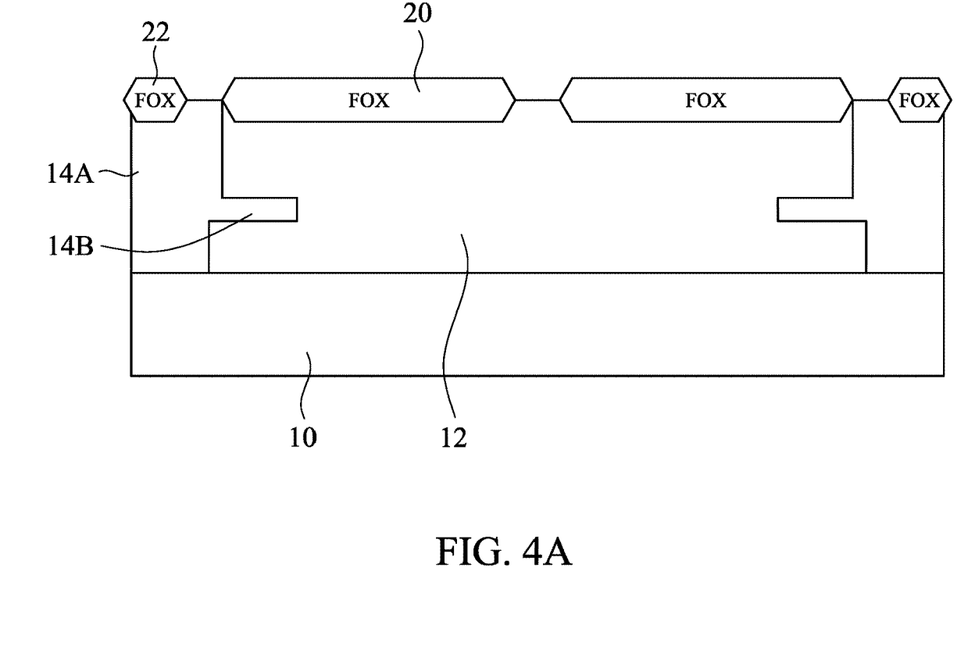
FIGS. 4A and 4B show one of the various stages of a manufacturing operation for a capacitor structure according to an embodiment of the present disclosure.
Figure 4B:
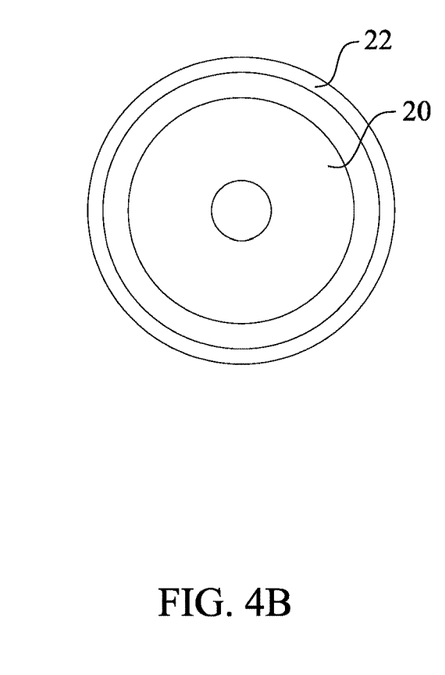

Then, as shown in FIGS. 4A and 4B, isolation insulating layers 20 and 22 are formed.

In some embodiments, the first and second isolation insulating layers 20, 22 are formed by local oxidation of silicon (LOCOS). In the LOCOS process, regions of the surface of the semiconductor (silicon) substrate 10 on which no oxide layer is formed are covered by a stacked layer of a pad silicon oxide layer and a silicon nitride layer on the pad silicon oxide layer. Then, a thermal oxidation process is performed at a temperature in a range from about 800° C. to about 1100° C., in some embodiments. The thermal oxidation process includes one of a dry oxidation process using O$_2$ gas, a wet oxidation process using O$_2$ gas with H$_2$O and a steam oxidation process using steam formed from H$_2$ and O$_2$ gas. In other embodiments, the first and second isolation insulating layers 20, 22 are shallow trench isolation (STI) layers. Regions of the surface of the semiconductor substrate 10 to be formed into the STI regions are trench-etched, and then one or more insulating layers are formed over the trench-etched substrate. Then, a planarization operation, such as a chemical mechanical polishing (CMP) process, is performed to remove excess portion of the insulating layers. In some embodiments, the insulating layer is silicon oxide formed by chemical vapor deposition (CVD), atomic layer deposition (ALD), or physical vapor deposition (PVD) including sputtering, or any other suitable film formation methods.

In some embodiments, after the isolation insulating layers 20 and 22 are formed, the n-well 12 and p-wells 14A and 14B are formed.

Then, an insulating layer, which also functions as a polysilicon etching stop layer in the subsequent process, is formed over the structure shown in FIGS. 4A and 4B. In some embodiments, the insulting layer is a silicon oxide layer formed by a thermal oxidation process. In other embodiments, the insulating layer is one or more of silicon oxide, silicon nitride and silicon oxynitride formed by CVD, ALD, PVD or any other film deposition methods.

After the insulating layer is formed, a first polysilicon layer for the first conductive layer 30 and the outer conductive layer 35 is blanket formed on the insulating layer. The first polysilicon layer is formed by CVD, ALD, PVD or any other film deposition methods. In some embodiments, the first polysilicon layer is in-situ doped with impurities, such as P, As and/or B. The thickness of the first polysilicon layer is in a range from about 500 nm to about 5000 nm in some embodiments.

Figure 5A:
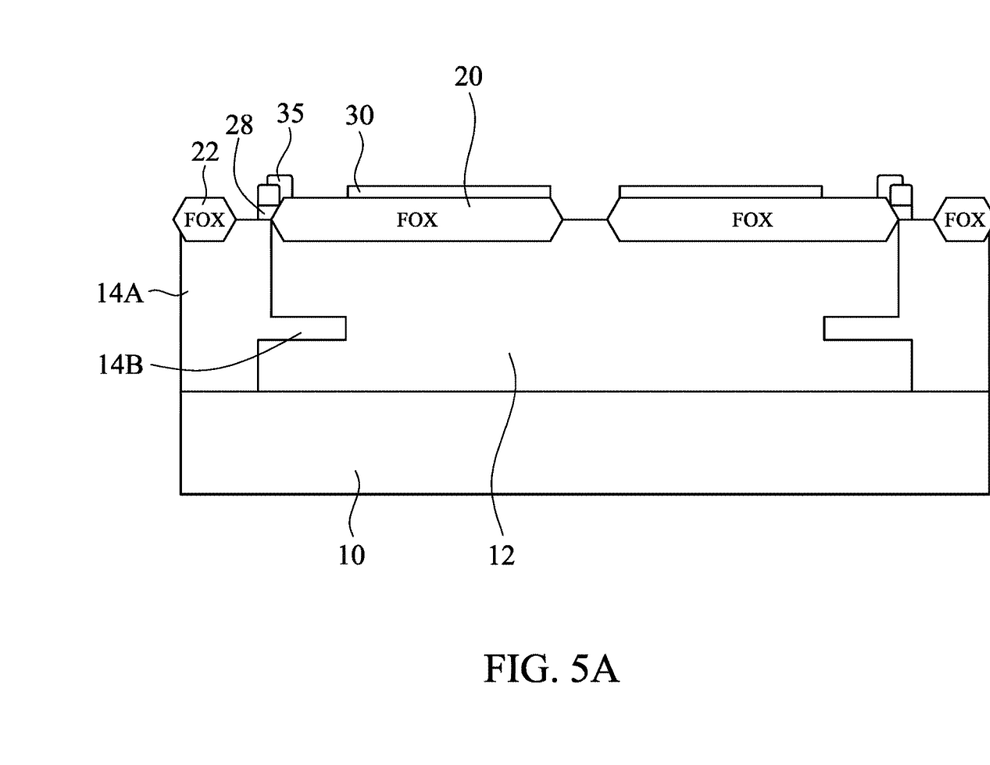
FIGS. 5A and 5B show one of the various stages of a manufacturing operation for a capacitor structure according to an embodiment of the present disclosure.
Figure 5B:
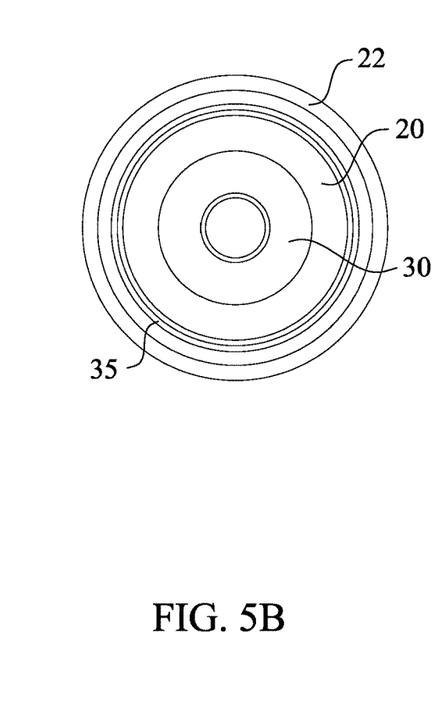

Then, by using one or more lithography and etching operations, the first polysilicon layer is patterned into first conductive layer 30 and the outer conductive layer 35 as shown in FIGS. 5A and 5B. The lithography operation includes ultra violet (UV) lithography, deep UV (DUV) lithography, extreme UV (EUV) lithography, or electron beam (e-beam) lithography. The etching operation includes plasma dry etching or wet etching. The polysilicon etching stops on the insulating layer (and the isolation insulating layers) in some embodiments. In some embodiments, a residual insulating layer 28 remains under the outer conductive layer 35.

Next, a blanket layer of a dielectric material for the capacitor dielectric layer 40 is formed and a blanket layer of a second polysilicon layer for the second conductive layer 50 is formed on the dielectric material layer. The dielectric material layer is one or more of silicon oxide, silicon nitride, titanium oxide, aluminum oxide, aluminum nitride, or any other suitable insulating materials. In some embodiments, the dielectric material layer includes one or more layers of ferroelectric dielectric material layers. For example, the dielectric material layer includes one or more materials selected from the group consisting of $Pb_3Ge_5O_{11}$ (PGO), lead zirconate titanate (PZT), $SrBi_2Ta_2O_9$ (SBT or SBTO), $SrB_4O_7$ (SBO), $Sr_aBi_bTa_cNb_dO_x$ (SBTN), $SrTiO_3$ (STO), $BaTiO_3$ (BTO), $(Bi_xLa_y)Ti_3O_{12}$ (BLT), $LaNiO_3$ (LNO), $YMnO_3$, $ZrO_2$, zirconium silicate, ZrAlSiO, $HfO_2$, $HfZrO_2$, hafnium silicate, HfAlO, LaAlO, lanthanum oxide, $HfO_2$ doped with Si ($HfSiO_x$), and $Ta_2O_5$. In some embodiments, $HfO_2$ doped with Si, Al and/or Zr or $ZrO_2$ doped with Si and/or Al is used as the dielectric material layer. The dielectric material layer is formed by CVD, ALD, PVD or any other film deposition methods. The thickness of the dielectric material layer is in a range from about 50 nm to about 500 nm in some embodiments.

The second polysilicon layer is formed by CVD, ALD, PVD or any other film deposition methods. In some embodiments, the second polysilicon layer is in-situ doped with impurities, such as P, As and/or B. In some embodiments, doping concentration of the second polysilicon layer is lower than doping concentration of the first polysilicon layer. In certain embodiments, the second polysilicon layer is not intentionally doped. The thickness of the second polysilicon layer is in a range from about 500 nm to about 5000 nm in some embodiments.

Figure 6A:
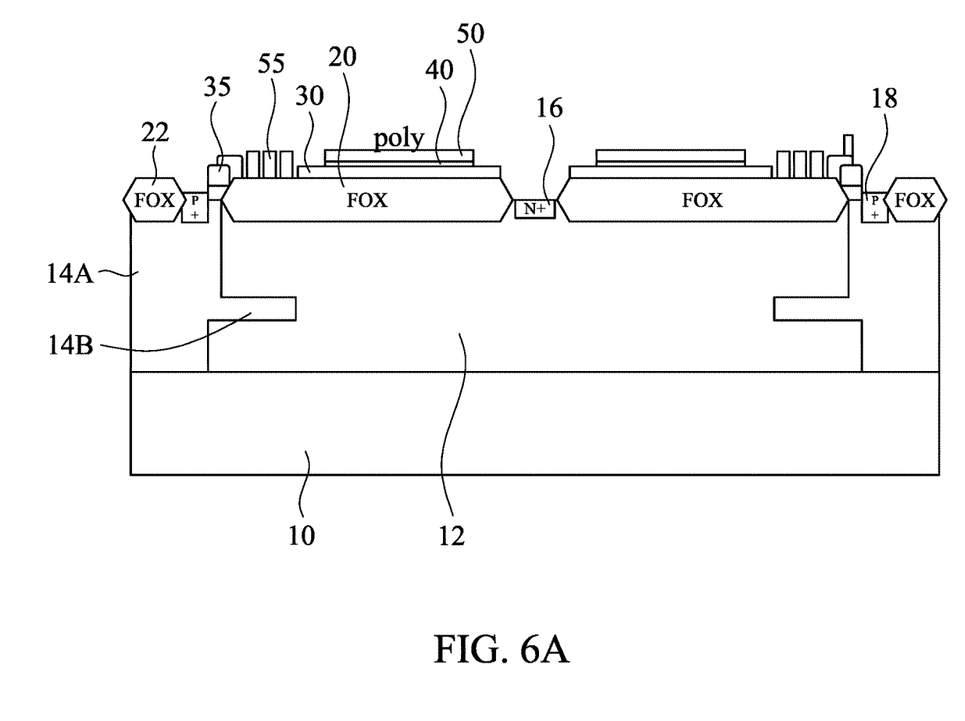
FIGS. 6A and 6B show one of the various stages of a manufacturing operation for a capacitor structure according to an embodiment of the present disclosure.
Figure 6B:
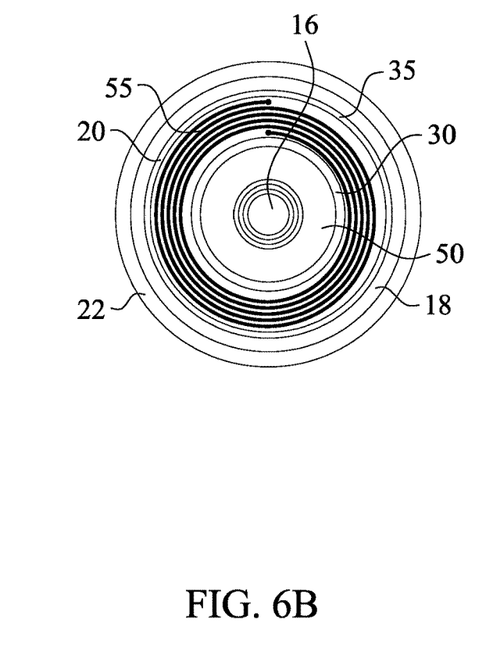

Then, by using one or more lithography and etching operations, the second polysilicon layer is patterned into the second conductive layer 50 and the resistor wire 55 as shown in FIGS. 6A and 6B. The lithography operation includes UV lithography, DUV lithography, EUV lithography, or e-beam lithography. The etching operation includes plasma dry etching or wet etching. The polysilicon etching stops on the insulating layer (and the isolation insulating layers) in some embodiments, and the polysilicon etching stops on the dielectric material layer in other embodiments.

In some embodiments, after the second polysilicon layer is patterned, the n+ region 16 and p+ region 18 are formed by one or more ion implantation processes. In other embodiments, after the first polysilicon layer is patterned and before the second polysilicon layer is formed, the n+ region 16 and p+ region 18 are formed by one or more ion implantation processes, or after the isolation insulating layer is formed and before the first polysilicon layer is formed, the n+ region 16 and p+ region 18 are formed by one or more ion implantation processes.

Subsequently, one or more interlayer dielectric (ILD) layers, via contact, metal wirings are formed. In some embodiments, two or more metal wiring layers interposing one or more of the ILD layers are provided.

Figure 7A:
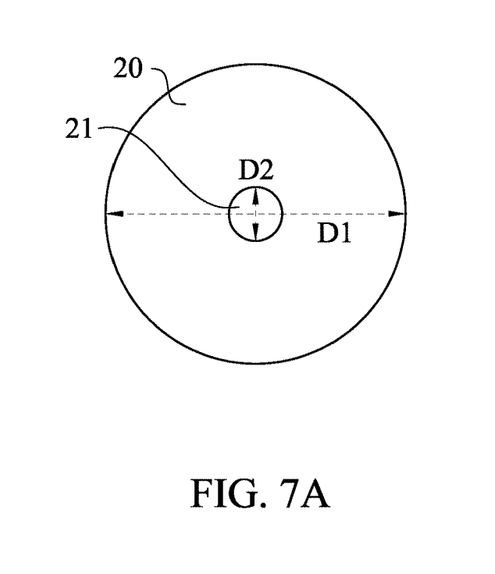
FIGS. 7A, 7B and 7C show various structures of capacitor structures according to embodiments of the present disclosure.
Figure 7B:
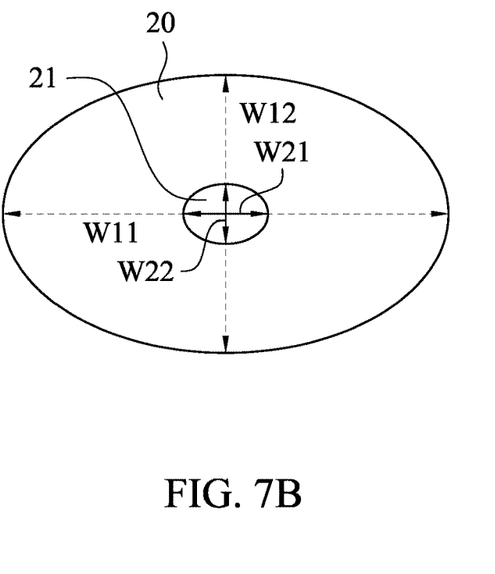
Figure 7C:
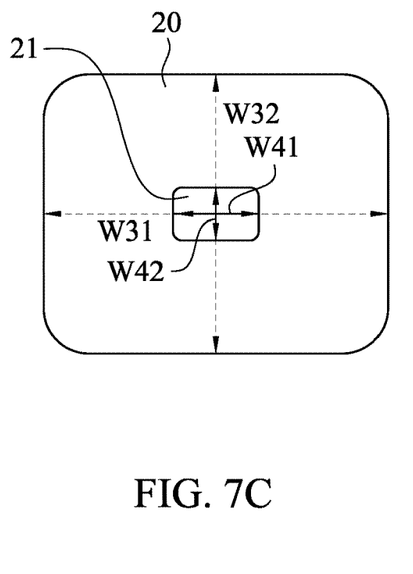

FIGS. 7A, 7B and 7C show various structures (plan views) of the isolation insulating layer 20 for capacitor structures according to embodiments of the present disclosure.

In FIG. 7A, the outer periphery of the isolation insulating layer 20 and the inner periphery of the center opening 21 are both circular. In some embodiments, a ratio of the diameter D1 of the outer periphery of the isolation insulating layer 20 and the diameter D2 of and the inner periphery of the center opening 21 is about $0.01 \leq D2/D1 \leq$ about 0.2. In such a case, the area of the center opening 21 is about 0.01% to about 4% of the area of the circle defined by the outer periphery of the first isolation insulating layer 20 (including the area of the center opening 21). In some embodiments, the center opening 21 and the first isolation insulating layer 20 are concentric. In other embodiments, the center of the center opening 21 and the center of the first isolation insulating layer 20 is not located at the same position. In some embodiments, the diameter D1 is in a range from about 1 μm to about 2000 μm, and is in a range from about 5 μm to about 500 μm in other embodiments.

In FIG. 7B, the outer periphery of the isolation insulating layer 20 and the inner periphery of the center opening 21 are both oval. In some embodiments, a ratio of the major axis W11 and the minor axis W12 of the outer periphery of the isolation insulating layer 20 is about $0.5 \leq W12/W11 <$ about 1.0. In some embodiments, a ratio of the major axis W21 and the minor axis W22 of the inner periphery of the center opening 21 is about $0.5 \leq W22/W21 <$ about 1.0. In some embodiments, the outer oval and the inner oval are geometrically similar, i.e., W12/W11=W22/W21. In some embodiments, a ratio of the major axis W11 of the outer periphery of the isolation insulating layer 20 and the major axis W21 of a the inner periphery of the center opening 21 is about $0.01 \leq W21/W11 \leq$ about 0.2. In such a case, the area of the center opening 21 is about 0.01% to about 4% of the area of the oval defined by the outer periphery of the first isolation insulating layer 20 (including the area of the center opening 21). In some embodiments, the center opening 21 and the first isolation insulating layer 20 are concentric. In other embodiments, the center of the center opening 21 and the center of the first isolation insulating layer 20 is not located at the same position.

In FIG. 7C, the outer periphery of the isolation insulating layer 20 and the inner periphery of the center opening 21 are both rectangular with rounded corners. In some embodiments, a ratio of the longer width W31 and the shorter width W32 of the outer periphery of the isolation insulating layer 20 is about 0.5≤W32/W31<about 1.0. In some embodiments, a ratio of the longer width W41 and the shorter width W42 of the inner periphery of the center opening 21 is about 0.5≤W42/W41<about 1.0. In some embodiments, the outer rectangle and the inner rectangle are geometrically similar, i.e., W32/W31=W42/W41. In some embodiments, a ratio of the longer width W31 of the outer periphery of the isolation insulating layer 20 and the longer width W41 of the inner periphery of the center opening 21 is about 0.01≤W41/W31≤about 0.2. In such a case, the area of the center opening 21 is about 0.01% to about 4% of the area of the oval defined by the outer periphery of the first isolation insulating layer 20 (including the area of the center opening 21). In some embodiments, the center opening 21 and the first isolation insulating layer 20 are concentric. In other embodiments, the center of the center opening 21 and the center of the first isolation insulating layer 20 is not located at the same position.

In the embodiments of FIGS. 7A-7C, any combination of the shapes of the outer periphery of the first isolation layer 20 and the inner periphery of the center opening 21 is possible.

Figure 8:
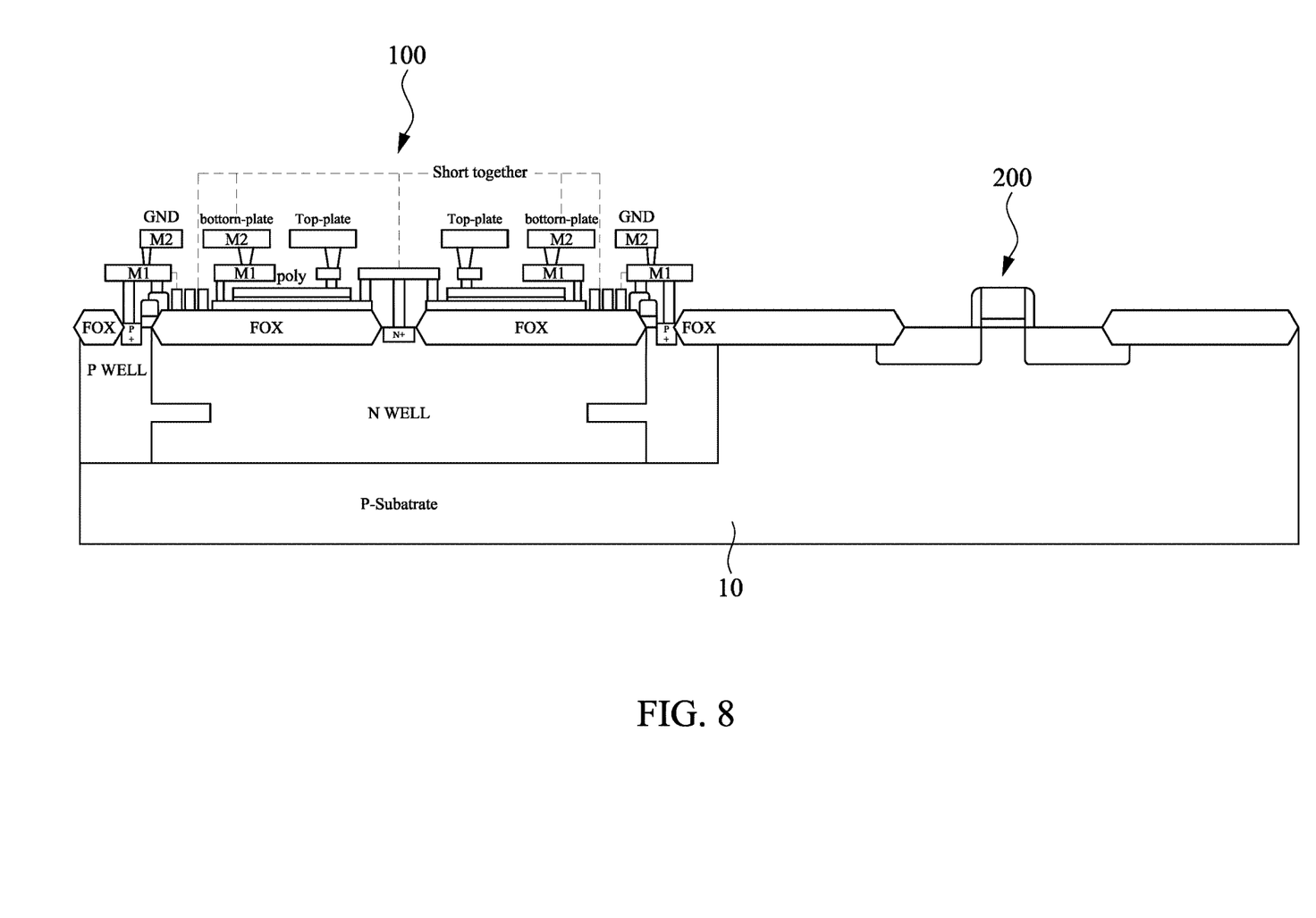
FIG. 8 shows a cross sectional view of a semiconductor device including a capacitor structure according to an embodiment of the present disclosure.

FIG. 8 shows a cross sectional view of a semiconductor device including a capacitor structure according to an embodiment of the present disclosure. As shown in FIG. 8, the capacitor structure 100 and a power semiconductor device 200 are integrally formed on the same substrate 10. In some embodiments, the power semiconductor device 200 is electrically coupled to the capacitor structure 100. In some embodiments, the power semiconductor device 200 includes one or more of a power MOS FET, a bipolar transistor, an insulated gate bipolar transistor (IGBT), a diode, a thyristor or any other semiconductor devices having a high operational voltage of more than 100 V. In other embodiments, the capacitor structure 100 is used with a micro electro mechanical system (MEMS).

In some embodiments, the capacitor structure 100 is formed during the manufacturing the power semiconductor device 200. In certain embodiments, one of the first conductive layer 30 and the second semiconductor layer 50, which is made of polysilicon, can be formed and patterned at the same process as the formation of a gate electrode of the power semiconductor device 200. Similarly, a gate dielectric layer of the power semiconductor device 200 is formed as the same layer as the capacitor dielectric layer 40 in some embodiments. In other embodiments, the first and second conductive layer and the capacitor dielectric layer of the capacitor structure 200 and the power semiconductor device are formed by different processes.

In some embodiments, a resistor wire 55 is not used. In other embodiments, a resistor wire is not formed by the second polysilicon layer (the same layer as the second conductive layer 50) and is formed by one or more diffusion regions formed at the surface region of the substrate 10, and/or by one or more metal wirings together with one or more via contacts. In other embodiments, the first isolation insulating layer 20 does not have a ring shape, and has a circular shape, an oval shape or a rectangular shape with rounded corners, without the center opening. In some embodiments, a RESURF well structure is not formed. In such a case, a region of the substrate 10 below the first isolation insulating layer 20 is a single n-well, a single p-well or an udoped layer.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In the present disclosure, a ring shape capacitor is disposed over a ring shape isolation insulating layer (field oxide) having a center opening. Further, one of the electrodes of the capacitor is coupled to a spiral resistor wire. The capacitor structure also has a RESURF well structure under isolation insulating layer. When a high voltage (e.g., 400V or more) is applied to the bottom electrode of the capacitor, which is electrically connected to one end of the spiral resistor wire and the center semiconductor region surrounded by the ring shaped isolation insulating layer, the voltage can be gradually reduced from the center to the edge portion under the isolation insulating layer due to the RESURF well structure. At the same time, the voltage of the spiral resistor wire disposed above the isolation insulating layer can also be gradually reduced from the center to the edge. These voltage reduction can cause a voltage across the isolation insulating layer to be smaller than the breakdown voltage of the isolation insulating layer (about 400 V, when the isolation insulating layer is silicon oxide). Accordingly, the capacitor structure of the present disclosure can operate at a voltage higher than 400 V. Further, in the present structure, it is relatively easy to increase/decrease the operation voltage by scaling up/down the horizontal dimensions of the capacitor structure.

In accordance with one aspect of the present disclosure, a capacitor structure for a power semiconductor device includes a semiconductor substrate, an isolation insulating layer having a ring-shape and including an outer periphery and an inner periphery defining an opening region, a first electrode disposed on the isolation insulating layer, a dielectric layer disposed on the first electrode, and a second electrode disposed on the dielectric layer. In one or more of the foregoing and following embodiments, each of the first electrode and the second electrode has a ring-shape. In one or more of the foregoing and following embodiments, the outer periphery of the ring-shape of the isolation insulating layer is circular. In one or more of the foregoing and following embodiments, the outer periphery of the ring-shape of the isolation insulating layer is oval. In one or more of the foregoing and following embodiments, the outer periphery of the ring-shape of the isolation insulating layer has a rectangular shape with rounded corners. In one or more of the foregoing and following embodiments, a size of the opening defined by the inner periphery is in a range from 0.01% to 10% of a size of an area defined by the outer periphery In one or more of the foregoing and following embodiments, the isolation insulating layer is LOCOS. In one or more of the foregoing and following embodiments, the first and second electrodes are formed of polysilicon. In one or more of the foregoing and following embodiments, the polysilicon is doped with impurities, and a doping concentration of the polysilicon for the first electrode is different from a doping concentration of the polysilicon for the second electrode. In one or more of the foregoing and following embodiments, the semiconductor substrate includes a first first-conductivity type well disposed below the isolation insulating layer, a first second-conductivity type well surrounding the first first-conductivity type well, and a second second-conductivity type well extending from the first second-conductivity type well and disposed in the first first-conductivity type well below the isolation insulating layer. In one or more of the foregoing and following embodiments, the first electrode is electrically coupled to the first first-conductivity type well through a heavily doped first-conductivity type region disposed in an area of the semiconductor substrate defined by the opening. In one or more of the foregoing and following embodiments, the first-conductivity type is n-type and the second conductivity type is p-type. In one or more of the foregoing and following embodiments, the capacitor structure further includes a resistor electrically coupled to the first electrode and a fixed potential. In one or more of the foregoing and following embodiments, the resistor is disposed on the isolation insulating layer and has a spiral shape surrounding the second electrode. In one or more of the foregoing and following embodiments, the first and second electrodes and the resistor are formed of polysilicon, and a sheet resistance of the first electrode and the resistor is lower than a sheet resistance of the second electrode. In one or more of the foregoing and following embodiments, a number of turns of the spiral shape is one to ten. In one or more of the foregoing and following embodiments, the fixed potential is a ground. In one or more of the foregoing and following embodiments, the first second-conductivity type well is electrically coupled to the ground.

In accordance with another aspect of the present disclosure, a capacitor structure for a power semiconductor device includes, a semiconductor substrate having a reduced surface well structure, an isolation insulating layer, a first electrode disposed on the isolation insulating layer; a dielectric layer disposed on the first electrode, a second electrode disposed on the dielectric layer, and a resistor electrically coupled to the first electrode and a fixed potential. In one or more of the foregoing and following embodiments, each of the first electrode and the second electrode has a ring-shape. In one or more of the foregoing and following embodiments, the outer periphery of the ring-shape of the isolation insulating layer is circular. In one or more of the foregoing and following embodiments, the outer periphery of the ring-shape of the isolation insulating layer is oval. In one or more of the foregoing and following embodiments, the outer periphery of the ring-shape of the isolation insulating layer has a rectangular shape with rounded corners. In one or more of the foregoing and following embodiments, a size of the opening defined by the inner periphery is in a range from 0.01% to 10% of a size of an area defined by the outer periphery. In one or more of the foregoing and following embodiments, the isolation insulating layer is LOCOS. In one or more of the foregoing and following embodiments, the first and second electrodes are formed of polysilicon. In one or more of the foregoing and following embodiments, the polysilicon is doped with impurities, and a doping concentration of the polysilicon for the first electrode is different from a doping concentration of the polysilicon for the second electrode. In one or more of the foregoing and following embodiments, the semiconductor substrate includes a first first-conductivity type well disposed below the isolation insulating layer, a first second-conductivity type well surrounding the first first-conductivity type well, and a second second-conductivity type well extending from the first second-conductivity type well and disposed in the first first-conductivity type well below the isolation insulating layer. In one or more of the foregoing and following embodiments, the first electrode is electrically coupled to the first first-conductivity type well through a heavily doped first-conductivity type region disposed in an area of the semiconductor substrate defined by the opening. In one or more of the foregoing and following embodiments, the first-conductivity type is n-type and the second conductivity type is p-type. In one or more of the foregoing and following embodiments, the resistor is disposed on the isolation insulating layer and has a spiral shape surrounding the second electrode. In one or more of the foregoing and following embodiments, the first and second electrodes and the resistor are formed of polysilicon, and a sheet resistance of the first electrode and the resistor is lower than a sheet resistance of the second electrode. In one or more of the foregoing and following embodiments, a number of turns of the spiral shape is one to ten. In one or more of the foregoing and following embodiments, the fixed potential is a ground. In one or more of the foregoing and following embodiments, the first second-conductivity type well is electrically coupled to the ground.

In accordance another aspect of the present disclosure, a power semiconductor device includes a power MOS transistor and a capacitor having a breakdown voltage in a range from 600 V to 1000 V. The capacitor includes a semiconductor substrate, an isolation insulating layer having a ring-shape and including an outer periphery and an inner periphery defining an opening region, a first electrode disposed on the isolation insulating layer, a dielectric layer disposed on the first electrode, and a second electrode disposed on the dielectric layer. In one or more of the foregoing and following embodiments, each of the first electrode and the second electrode has a ring-shape. In one or more of the foregoing and following embodiments, the outer periphery of the ring-shape of the isolation insulating layer is circular. In one or more of the foregoing and following embodiments, the outer periphery of the ring-shape of the isolation insulating layer is oval. In one or more of the foregoing and following embodiments, the outer periphery of the ring-shape of the isolation insulating layer has a rectangular shape with rounded corners. In one or more of the foregoing and following embodiments, a size of the opening defined by the inner periphery is in a range from 0.01% to 10% of a size of an area defined by the outer periphery. In one or more of the foregoing and following embodiments, the isolation insulating layer is LOCOS. In one or more of the foregoing and following embodiments, the first and second electrodes are formed of polysilicon. In one or more of the foregoing and following embodiments, the polysilicon is doped with impurities, and a doping concentration of the polysilicon for the first electrode is different from a doping concentration of the polysilicon for the second electrode. In one or more of the foregoing and following embodiments, the semiconductor substrate includes a first first-conductivity type well disposed below the isolation insulating layer, a first second-conductivity type well surrounding the first first-conductivity type well, and a second second-conductivity type well extending from the first second-conductivity type well and disposed in the first first-conductivity type well below the isolation insulating layer. In one or more of the foregoing and following embodiments, the first electrode is electrically coupled to the first first-conductivity type well through a heavily doped first-conductivity type region disposed in an area of the semiconductor substrate defined by the opening. In one or more of the foregoing and following embodiments, the first-conductivity type is n-type and the second conductivity type is p-type. In one or more of the foregoing and following embodiments, the capacitor structure further includes a resistor electrically coupled to the first electrode and a fixed potential. In one or more of the foregoing and following embodiments, the resistor is disposed on the isolation insulating layer and has a spiral shape surrounding the second electrode. In one or more of the foregoing and following embodiments, the first and second electrodes and the resistor are formed of polysilicon, and a sheet resistance of the first electrode and the resistor is lower than a sheet resistance of the second electrode. In one or more of the foregoing and following embodiments, a number of turns of the spiral shape is one to ten. In one or more of the foregoing and following embodiments, the fixed potential is a ground. In one or more of the foregoing and following embodiments, the first second-conductivity type well is electrically coupled to the ground.

In accordance with one aspect of the present disclosure, in a method of manufacturing a capacitor structure, a well structure is formed in a semiconductor substrate. An isolation insulating layer is formed on the semiconductor substrate. The isolation insulating layer has a ring-shape and includes an outer periphery and an inner periphery defining an opening region. A first electrode is formed over the isolation insulating layer. A dielectric layer is formed on the first electrode. A second electrode is formed over the dielectric layer. In one or more of the foregoing and following embodiments, each of the first and the second electrodes has a ring-shape. In one or more of the foregoing and following embodiments, the outer periphery of the ring-shape of the isolation insulating layer is circular. In one or more of the foregoing and following embodiments, the outer periphery of the ring-shape of the isolation insulating layer is oval. In one or more of the foregoing and following embodiments, the outer periphery of the ring-shape of the isolation insulating layer has a rectangular shape with rounded corners. In one or more of the foregoing and following embodiments, a size of the opening defined by the inner periphery is in a range from 0.01% to 10% of a size of an area defined by the outer periphery. In one or more of the foregoing and following embodiments, the semiconductor substrate is made of Si, and the isolation insulating layer formed by local oxidation of the semiconductor substrate. In one or more of the foregoing and following embodiments, the first and second electrodes are polysilicon formed by CVD. In one or more of the foregoing and following embodiments, the polysilicon is doped with impurities, and a doping concentration of the polysilicon for the first electrode is different from a doping concentration of the polysilicon for the second electrode. In one or more of the foregoing and following embodiments, the well structure includes a first first-conductivity type well disposed below the isolation insulating layer, a first second-conductivity type well surrounding the first first-conductivity type well, and a second second-conductivity type well extending from the first second-conductivity type well and disposed in the first first-conductivity type well below the isolation insulating layer. In one or more of the foregoing and following embodiments, a heavily doped first-conductivity type region is formed in an area of the semiconductor substrate defined by the opening. The first electrode is electrically coupled to the first first-conductivity type well through the heavily doped first-conductivity type region. In one or more of the foregoing and following embodiments, the first-conductivity type is n-type and the second conductivity type is p-type.

In accordance with another aspect of the present disclosure, in a method of manufacturing a capacitor structure, an isolation insulating layer is formed on a semiconductor substrate. The isolation insulating layer has a ring-shape and includes an outer periphery and an inner periphery defining an opening region. A first conductive layer is formed and patterned to form a first electrode disposed on the isolation insulating layer. A dielectric layer is formed over the first electrode. A second conductive layer is formed and patterned to form a second electrode and a resistor wire over the isolation insulating layer. In one or more of the foregoing and following embodiments, the resistor wire has a spiral shape surrounding the first electrode. In one or more of the foregoing and following embodiments, a number of turns of the spiral shape is one to ten. In one or more of the foregoing and following embodiments, each of the first and the second electrodes has a ring-shape. In one or more of the foregoing and following embodiments, the first and second conductive layers are polysilicon formed by CVD, and a sheet resistance of the first conductive layer and the resistor is lower than a sheet resistance of the second conductive layer.

In accordance with another aspect of the present disclosure, in a method of manufacturing a capacitor structure, a well structure is formed in a semiconductor substrate. An isolation insulating layer is formed on the semiconductor substrate. The isolation insulating layer has a ring-shape and includes an outer periphery and an inner periphery defining an opening region. A first conductive layer is formed and patterned to form a first electrode disposed on the isolation insulating layer and an outer conductive pattern surrounding the first electrode. A dielectric layer is formed over the first electrode. A second conductive layer is formed and patterned to form a second electrode and a resistor wire over the isolation insulating layer disposed between the first electrode and the outer conductive pattern. In one or more of the foregoing and following embodiments, each of the first and the second electrodes has a ring-shape. In one or more of the foregoing and following embodiments, the well structure is a reduced surface field (RESURF) well structure.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a semiconductor substrate;
   an isolation insulating layer having an opening region;
   a first electrode disposed on the isolation insulating layer and surrounding the opening region of the isolation insulating layer in plan view;
   a dielectric layer disposed on the first electrode; and
   a second electrode disposed on the dielectric layer and surrounding the opening region of the isolation insulating layer in plan view.

2. The semiconductor device of claim 1, wherein the isolation insulating layer has a frame shape and includes an outer periphery and an inner periphery defining the opening region.

3. The semiconductor device of claim 2, wherein the first electrode has a frame-shape.

4. The semiconductor device of claim 3, wherein the second electrode has a frame-shape.

5. The semiconductor device of claim 1, wherein an entirety of the first electrode is disposed over the isolation insulating layer.

6. The semiconductor device of claim 1, wherein an entirety of the second electrode is disposed over the isolation insulating layer.

7. The semiconductor device of claim 1, wherein an entirety of the dielectric layer is disposed over the isolation insulating layer.

8. The semiconductor device of claim 1, wherein the first and second electrodes are formed of polysilicon.

9. The semiconductor device of claim 8, wherein:
the polysilicon is doped with impurities, and
a doping concentration of the polysilicon for the first electrode is different from a doping concentration of the polysilicon for the second electrode.

10. A semiconductor device, comprising:
a semiconductor substrate;
an isolation insulating layer having a ring-shape and comprising an outer periphery and an inner periphery defining an opening region;
a first electrode disposed on the isolation insulating layer;
a dielectric layer disposed on the first electrode; and
a second electrode disposed on the dielectric layer, wherein:
the semiconductor substrate includes:
a first first-conductivity type diffusion region disposed below the isolation insulating layer;
a first second-conductivity type diffusion region having a ring shape and surrounding the first first-conductivity type diffusion region; and
a second second-conductivity type diffusion region having a ring shape and laterally extending from the first second-conductivity type diffusion region toward the opening region in plan view, and penetrate into the first first-conductivity type diffusion region below the isolation insulating layer.

11. The semiconductor device of claim 10, wherein a part of the first conductivity type diffusion region is disposed between the isolation insulating layer and second second-conductivity type diffusion region.

12. The semiconductor device of claim 11, wherein the semiconductor substrate includes a second first-conductivity type diffusion region disposed at the opening region in the first first-conductivity type diffusion region and having a higher doping concentration than the first first-conductivity type diffusion region.

13. The semiconductor device of claim 12, wherein the semiconductor substrate includes a third second-conductivity type diffusion region disposed at a surface area of the first second-conductivity type diffusion region and having a higher doping concentration than the first second-conductivity type diffusion region.

14. The semiconductor device of claim 13, wherein the first electrode is electrically connected to the first first-conductivity type diffusion region through the second first-conductivity type diffusion region.

15. The semiconductor device of claim 11, wherein an opening region of the ring shape of the second second-conductivity type diffusion region is larger than the opening region of the isolation insulating layer.

16. A semiconductor device comprising:
a semiconductor substrate;
an isolation insulating layer having a ring-shape having an opening region;
a first electrode having a ring shape and disposed on the isolation insulating layer;
a dielectric layer disposed on the first electrode; and
a second electrode having a ring shape and disposed on the dielectric layer, wherein:
the semiconductor substrate includes:
a first first-conductivity type diffusion region disposed below the isolation insulating layer;
a first second-conductivity type diffusion region having a ring shape and surrounding the first first-conductivity type diffusion region; and
a second second-conductivity type diffusion region having a ring shape and laterally extending from the first second-conductivity type diffusion region toward the opening region in plan view, and penetrate into the first first-conductivity type diffusion region below the isolation insulating layer, and
the first and second second-conductivity type diffusion regions are connected to a fixed potential.

17. The semiconductor device of claim 16, wherein the first electrode and the resistor are disposed on the same isolation insulating layer.

18. The semiconductor device of claim 16, further comprising a resistor electrically connected to the first electrode and the fixed potential and surrounding the first and second electrodes.

19. The semiconductor device of claim 18, wherein the resistor has a spiral shape surrounding the first and second electrodes.

20. The semiconductor device of claim 16, further comprising a power MOS transistor formed over the substrate.

* * * * *